United States Patent [19]

Novotny

[11] Patent Number: 5,206,791
[45] Date of Patent: Apr. 27, 1993

[54] BELLOWS HEAT PIPE APPARATUS FOR COOLING SYSTEMS

[75] Inventor: Shlomo D. Novotny, Wayland, Mass.

[73] Assignee: Digital Equipment Corporation, Maynard, Mass.

[21] Appl. No.: 832,524

[22] Filed: Feb. 7, 1992

[51] Int. Cl.⁵ ............................................. H05K 7/20
[52] U.S. Cl. ................................. 361/385; 361/386; 361/388; 174/16.3; 165/185; 257/715
[58] Field of Search ............... 361/380, 381, 382, 385, 361/386, 387, 388; 174/15.1, 15.2, 16.3; 165/66, 80.4, 80.5, 185; 357/81, 82

[56] References Cited

U.S. PATENT DOCUMENTS

| | | | |
|---|---|---|---|
| 4,138,692 | 2/1979 | Meeker et al. | 357/82 |
| 4,212,349 | 7/1980 | Andros et al. | 165/105 |
| 4,712,158 | 12/1987 | Kikuchi et al. | 361/385 |
| 4,729,060 | 3/1988 | Yamamoto et al. | 361/385 |
| 4,912,548 | 3/1990 | Shanker et al. | 357/82 |
| 4,951,740 | 8/1990 | Peterson et al. | 165/32 |
| 4,982,274 | 1/1991 | Murase et al. | 357/82 |
| 5,050,037 | 9/1991 | Yamamoto et al. | 361/385 |

Primary Examiner—Leo P. Picard
Assistant Examiner—Young S. Whang
Attorney, Agent, or Firm—Denis G. Maloney; Barry Young; Ronald Myrick

[57] ABSTRACT

Provided is a cooling system for transferring heat away from heat dissipative devices. The cooling system includes a thermally conductive heat sink member which is connected on one side to a heat dissipating device and attached on the second side to a resilient bellows pipe element filled with liquid coolant. The other end of the bellows is attached to and communicates with an evaporator section which communicates with a condenser section. The thermally conductive heat sink member, which may include thermally conductive fins, conducts transfers heat energy from the heat dissipating device to the liquid coolant. As the liquid coolant in the heat pipe heats and expands, the liquid in evaporator section of the cooling system can evaporate, the vapor passing to the condenser section. Vapor cools and returns to liquid state in the condenser section, wherein it is gravitationally returned to the evaporator section of the cooling device.

21 Claims, 3 Drawing Sheets

BELLOWS HEAT PIPE APPARATUS FOR COOLING SYSTEMS

FIELD OF THE INVENTION

This invention relates to cooling systems, and more particularly to cooling systems employing heat pipe apparatus.

BACKGROUND OF THE INVENTION

The manufacturers of integrated circuits typically specify maximum operating temperature for reliable operation. Exceeding the maximum specified temperature may damage the integrated circuit, and would affect the long term reliability of the integrated circuit. It is therefore desirable to keep the integrated circuit operating temperature below the maximum operating temperature of the device.

Heat pipe apparatus have been used to transfer the heat energy away from the integrated circuit or integrated circuit package. A basic heat pipe apparatus is comprised of four elements: a thermally conductive material attached to the exposed surface of an integrated circuit (or integrated circuit package), a pipe element connecting the thermally conductive material to a cooling mechanism, and a liquid contained within the pipe element. As the temperature of the integrated circuit increases, it heats the liquid to its boiling point and the liquid evaporates. As the resultant vapor passes along the length of the pipe, it is cooled by the cooling mechanism, condenses, and flows back towards the integrated circuit. The section of the device where the heating of the liquid takes place is referred to as the evaporator section, while the section of the device where the vapor reaches the cooling mechanism and is condensed is the condenser section.

A variety of methods is used for conveying the liquid between the evaporator and condenser sections. A passive method referred to as thermo-syphon cooling utilizes the natural forces of gravity and buoyancy in a heat pipe apparatus. In thermo-syphon heat pipe apparatus, the condenser section is positioned above the evaporator section. The buoyancy of the vapor causes it to rise naturally upwards towards the condenser section. The condensate is returned to the evaporator section by gravitational forces. Thermo-syphon cooling provides a passive and inexpensive method for heat dissipation.

Another consideration arises in systems having many integrated circuits or integrated circuit packages assembled on a planar circuit board which are to be associated with a common cooling device. If the integrated circuits or integrated circuit packages do not all have the same height, the distances from the tops of the integrated circuit packages to the cooling apparatus differ from each other. One method of resolving the height differential problem is to use a resilient bellows pipe element between each integrated circuit package and a common condenser device. One example of a heat pipe apparatus for cooling integrated circuits in a multi-chip assembly which uses a bellows pipe element in this manner is discussed in U.S. Pat. No. 4,951,740 issued Aug. 28, 1990 to Peterson et. al. In Peterson's system each bellows pipe element communicates with the common condenser at its top end and is attached to an integrated circuit at its bottom end. The interior bottom surface of the bellows device is lined with a wick saturated with a working fluid. This section of the bellows device is the evaporator section. Wicks also line the interior sidewalls of the bellows, and a wick extends longitudinally within the bellows. Each bellow device communicates with a corresponding condenser section. The condenser subsections are interconnected to allow the vapor pressure in the entire condenser section to equalize, enabling uniform longitudinal activity of the condenser section. Each condenser subsection is lined with wicks which extend into the associated bellows device.

During integrated circuit operation, the integrated circuit or integrated circuit package generates heat energy which causes the working fluid in the evaporator section to vaporize and rise towards the condenser subsection. The vapor condenses at the condenser subsection and is returned to the evaporator section of the bellows device along the internal wick pathways.

Because Peterson's invention involves a sealed system, there is a potential for non-condensable vapor to be trapped in the condenser subsection, causing the condenser section to act as a heat insulator. The condenser wicks absorb the non-condensable vapor to help to prevent this potential hazard. In addition, because the saturated wick reservoir in the bottom of the bellows device has a relatively small capacity, condensed working fluid must be rapidly returned to the wick reservoir for re-evaporation and maintenance of cooling system equilibrium. The addition of the longitudinal wick and the interior sidewall wicks provide controlled pathways for liquid return to the wick reservoir.

A thermal problem which can be encountered in heat pipe design revolves around the connection between the integrated circuit and the heat pipe apparatus. When a heat pipe apparatus is rigidly attached with epoxy or solder, there is the potential danger that hot spots from the integrated circuit could cause the evaporator section of the bellows device to expand unevenly. It is desirable to protect against hot spots which could cause uneven expansion between the bellows device and the integrated circuit. Uneven expansion could potentially eliminate contact between parts of the two surfaces and the resulting insufficient cooling could damage the integrated circuit. Peterson's design addresses the problem of thermal expansion between the heat pipe apparatus and the integrated circuit with wicks which line the bottom of the evaporator section of the bellows device. The wick section spreads fluid evenly and is intended to prevent the formation of hot spots in the area where the bellows contacts the integrated circuit.

It would be desirable from a manufacturing standpoint to provide a cooling system which would eliminate the use of expensive wicks while relieving the adverse effects arising from thermal expansion discussed above. Further, it would be desirable to provide a wickless cooling system in which the evaporator device is distributed among many heat pipe apparatus in a multi-chip assembly.

SUMMARY OF INVENTION

According to the invention, an improved cooling system includes a thermally conductive heat sink member attached to one end of a resilient bellows pipe element filled with liquid coolant. The other end of the bellows is attached to and communicates with an evaporator section which communicates with a condenser section. The evaporator section is also partially filled with liquid coolant.

In a particular application of such a system, the thermally conductive heat sink member is connected to an integrated circuit or integrated circuit package which in operation generates heat. The resilient bellows pipe element, preferably expandable in 3 planes, supplies a mechanical load between the evaporator section and the integrated circuit package for maintaining contact between the conductive heat sink member and the integrated circuit package. The heated liquid in the evaporator section can evaporate, the vapor passing to the condenser section and returning in a liquid state back to the evaporate section. In addition, the use of resilient bellows permits different integrated circuit heights to be accommodated as well as different temperature variations in a system design incorporating a shared evaporator section.

Advantageously, thermally conductive fins project from the surface of the conductive heat sink member connected to the resilient bellows pipe element. These fins are immersed in the cooling liquid during operation of the cooling system, and increase the effective overall thermally conductive surface area of the conductive heat sink member, thereby enhancing thermal dissipation into the liquid. In addition, the increase of surface area decreases the power dissipation density, reducing the potential for boil off of liquid which can occur when the heat flux increases to the critical heat flux temperature.

The bottom face of the conductive heat sink member is preferably attached by thermally conductive filling material to the heat dissipating device, for example an integrated circuit or integrated circuit package. This face of the conductive heat sink member may advantageously incorporate a series of ridged protuberances. The protuberances increase the surface area of the conductive heat sink member, thereby enhancing its thermal dissipation efficiency. A conductive malleable material is compressed between the ridged surface and a surface of the integrated circuit. The malleable material reduces thermal resistance by filling included air voids. In addition, the malleable material acts to dissipate hot spots from the integrated circuit over a larger surface area of the conductive heat sink member, thereby reducing the potential for uneven expansion of the conductive heat sink member. Reduced probability of expansion serves to reduce the probability of loss of thermal transfer contact between the conductive heat sink member and the integrated circuit.

A heat pipe apparatus embodying the invention utilizes thermo-syphon cooling for passive cooling without the need for extraneous materials. As the liquid is heated by thermal dissipation from the conductive heat sink member and the fins, it evaporates and naturally rises from the evaporator section to the condenser section of the cooling device. As it condenses it is gravitationally returned to the evaporator section.

A heat pipe apparatus embodying the invention enables construction of an inexpensive apparatus for rapidly dissipating thermal energy while maintaining minimal thermal contact resistance between the cooling device and an integrated circuit, for example. The resilient bellows pipe element permits the heat pipe apparatus to be used in a system employing different height integrated circuits. Additionally, the malleable filling material utilized in the preferred embodiment of the invention reduces the probability of uneven expansion and device failure by dissipation of hot spots.

Other objects, features and advantages of the invention will become apparent from a reading of the description of the preferred embodiment of the invention when taken in conjunction with the drawings in which like reference numerals refer to like elements in the several views.

DETAILED DESCRIPTION OF PREFERRED EMBODIMENT

Figure 1:
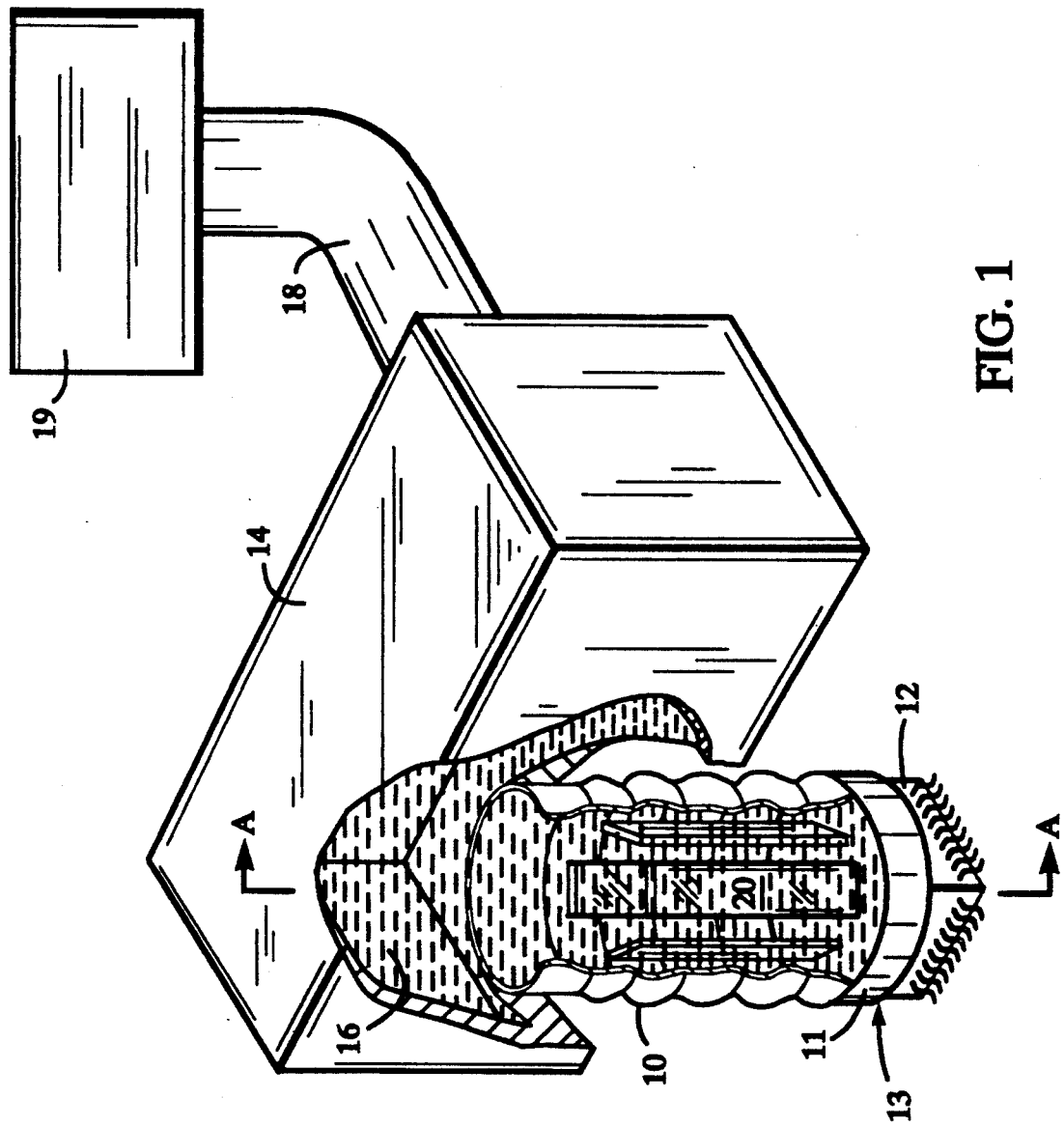
FIG. 1 is an isometric view of a cooling system embodying the invention attached to an electronic device.

Referring now to the drawings, FIG. 1 shows a cooling system embodying the invention. The cooling system comprises a resilient bellows pipe element 10 having a closed lower end connected to the top surface of a thermally conductive heat sink member 11 by soldering, brazing or other heat hermetically sealed conductive connection means. The bottom surface of the conductive heat sink member 11 is connected to an integrated circuit or integrated circuit package 12 by a layer of thermally conductive filling material 13. The upper, open end of the resilient pipe element is sealed to and communicates with the interior of an evaporator section 14. The evaporator section 14 and the bellows element 12 contain working liquid 16. The evaporator section 14 is located below a condenser section 19 and is connected to it by a pipe 18 so that liquid 16 which evaporates can flow from the evaporator to the condenser section 19 and return after it has been condensed.

As the temperature of the integrated circuit or integrated circuit package 12 increases, heat energy is conducted through the thermally conductive filling material 13 to the conductive heat sink member 11. Spaced apart thermally conductive solid fins 20 upstanding from the top surface of the conductive heat sink member 11 within the resilient pipe element 10 provide an extended surface area for dissipation of heat energy from the conductive heat sink member 11 into the liquid 16. In addition, the extended surface area reduces the heat dissipation density and thus minimizes the potential for boil off of the working liquid 16. Both the fins 20 and the conductive heat sink member 11 are fabricated from a thermally conductive material such as copper or kovar. The working liquid 16 within the pipe element must be volatile at the temperatures expected under normal operation of the integrated circuit; alcohol and water are suitable. However, the desired boiling point of the liquid may be decreased by decreasing the pressure within the evaporator section 14. As the integrated circuit or integrated circuit package 12 generates heat during operation, heat transfer occurs from the integrated circuit or integrated circuit package 12 to the conductive heat sink member 11 and to the liquid 16 which fills the resilient bellows.

The heated liquid 16 eventually evaporates in the evaporator section 14 and the resultant vapor is forced through the connecting pipe 18 into the condenser section 19. The condenser section 19 is a heat sink device maintained at a constant low temperature by means of forced cool air or cool liquid. The reduced temperature of the condenser section 19 is sufficiently low to reconsolidate the vapor into liquid 16. The liquid 16 is gravitationally returned to the evaporator section 14 by the connecting pipe 18. This passive approach of allowing the buoyancy of vapor to rise from the evaporator section to the condenser section 19 and gravity to return the condensate to the evaporator section 14 is referred to as thermo-syphon cooling.

The resilient bellows pipe element 10 is expandable in all three axial dimensions. The spring constant of the resilient bellows pipe element 10 provides the mechanical load for maintaining constant contact between the conductive heat sink member 11 and the integrated circuit or integrated circuit package 12. Maintaining the correct mechanical load reduces the thermal contact resistance between the conductive heat sink member 11 and the integrated circuit device 12. The mechanical load is typically calculated based on the pressure that is optimal for lowest contact resistance. The minimum pressure required for lowest contact resistance is a function of the characteristics of the surface finish of the integrated circuit device 12, the bellows material which contacts the integrated circuit (the bellows sink material), and the thermally conductive filling material 13. For example, the calculations for the preferred embodiment could be derived utilizing an integrated circuit with a smooth surface finish, a bellows sink material made of polished copper and filling material comprised of indium. A bellows device providing approximately 50 pounds per square inch of mechanical load on the integrated circuit device could satisfy the minimum pressure requirement and accordingly optimum thermal transfer between the integrated circuit 12 and the liquid 16.

Enhanced thermal contact is additionally achieved in a preferred embodiment of this invention by a series of ridged protuberances 24 over the bottom face of the conductive heat sink member 11, the spaces between which are filled by the thermally conductive filling material 13. The protuberances 24 increase the conductive surface area of the conductive heat sink member 11, thereby increasing the thermal dissipation potential between the conductive heat sink member 11 and the integrated circuit or integrated circuit package 12. The filling material 13 preferably comprises a malleable thermally conductive material 26, such as a metal (for example silver or indium), or other organic or non organic filler, liquid or paste with high thermal conductivity. As the surface of the integrated circuit device or integrated circuit package 12, the malleable filling material 26 and the conductive heat sink member 11 are mated together, the malleable material 26 fills in any included air voids, improving thermal exchange between the integrated circuit or integrated circuit package 12 and the conductive heat sink member 11. The increased surface area provided by the protuberances 24 along with the thermal conductivity of the malleable material 26 serve to dissipate hot spots emanating from the integrated circuit or integrated circuit package 12 over a larger surface area on the conductive heat sink member 11. The dissipation of hot spots reduces the potential for loss of contact between the conductive heat sink member 11 and the integrated circuit 12 due to uneven expansion of the conductive heat sink member 11.

Alternative filling means include direct soldering of the conductive heat sink member 11 to the integrated circuit device 12 or gluing the two surfaces together with epoxy. These filling means result in a fixed bond between the two devices, and the mechanical load of the resilient bellows does not participate in optimizing the thermal exchange between the devices. Non-bonding filling means include the use of interstitial fluid between the two surfaces or even dry contact, wherein no filling material is used and contact is maintained solely through the mechanical load of the resilient bellows which produces pressure between the conductive heat sink member 11 and the integrated circuit 12. Although bonding material is effective, it is believed that the non-bonding thermally conductive filling material used in the preferred embodiment of the invention is most effective for optimal thermal transfer in conjunction with the dissipation of hot spots from the heat dissipating device.

Figure 3:
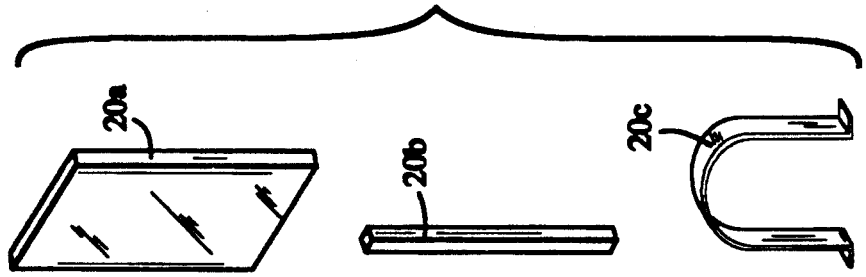
FIG. 3 pictorially shows various fins which can be used in the apparatus of FIG. 1.
Figure 2:
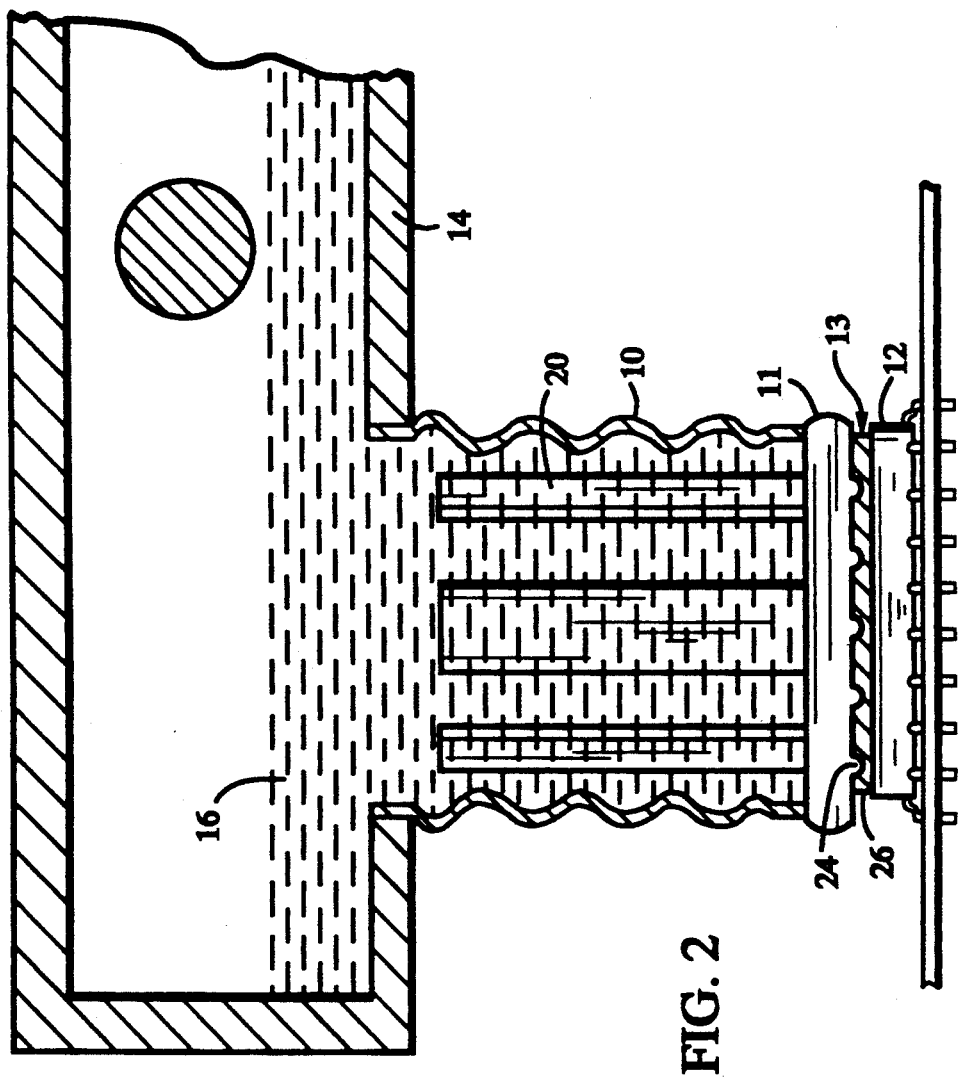
FIG. 2 is an axial section taken along the line AA in FIG. 1.

In addition to improving the thermal exchange between the integrated circuit device 12 and the conductive heat sink member 11, this embodiment of the invention also improves the thermal exchange between the conductive heat sink member 11 and the liquid 16 by reason of the attachment of the heat dissipative fins 20 to the top of the conductive heat sink member 11 such that the fins 20 extend lengthwise into the resilient bellows pipe element 10. The addition of fins 20 increases the effective surface area of the conductive heat sink member 11, thereby increasing the rate of thermal dissipation of heat energy into the liquid 16. Exemplary fin shapes 20a, 20b, 20c are shown in FIG. 3. The fins 20a, 20b, 20c should be shaped to increase the surface area to volume ratio, and should be sized such that they fit within the resilient bellows pipe element 10 while allowing free circulation of liquid. However, the fins 20, although advantageous are not an essential feature of this invention.

Figure 4:
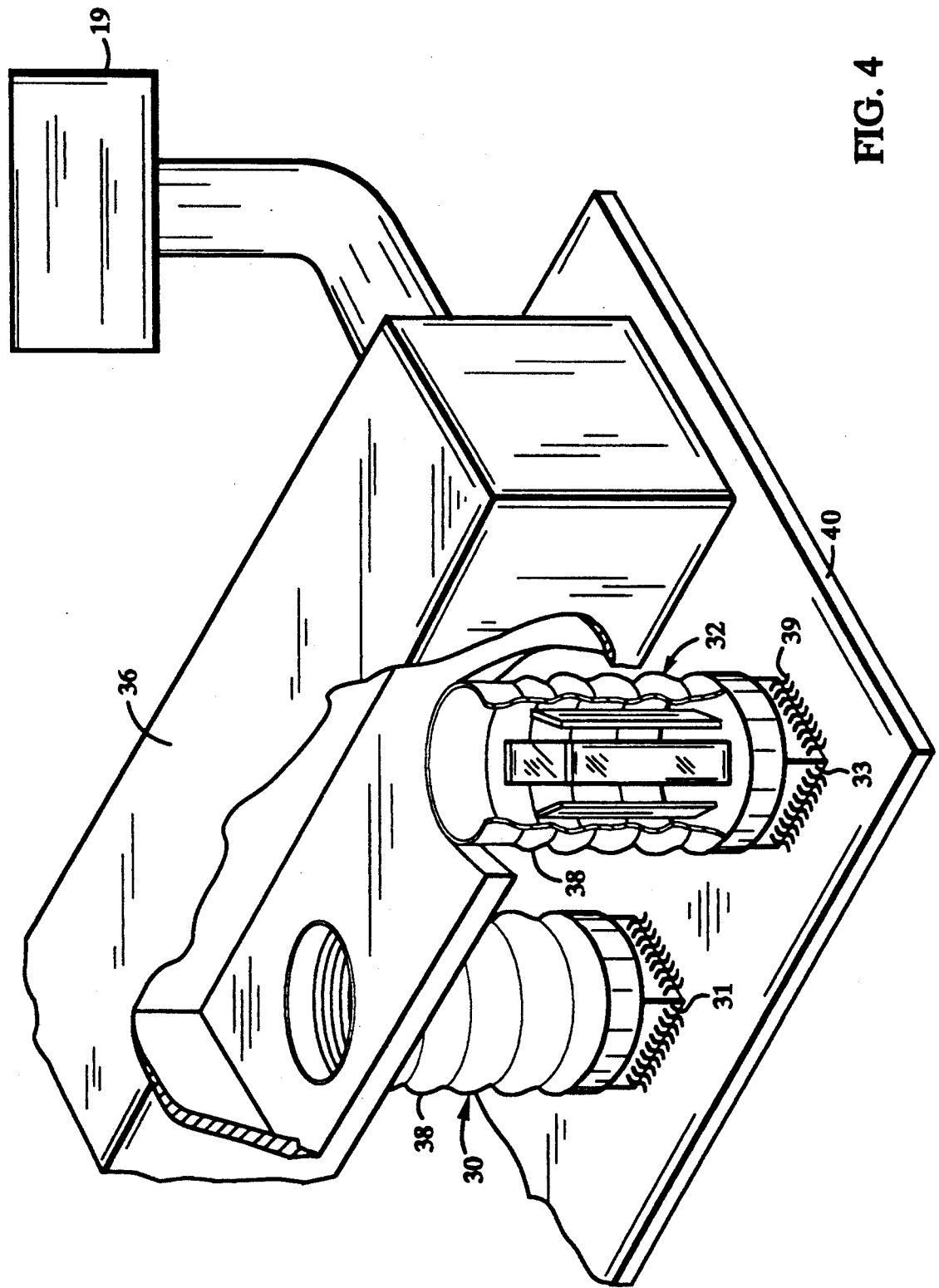
FIG. 4 illustrates an embodiment of the invention in which multiple heat pipes are attached to a common evaporator section.

FIG. 4 illustrates a multi-chip assembly comprising separate heat pipes connecting individual integrated circuits or integrated circuit packages to a common evaporator section 36. For simplicity, only two heat pipes 30 and 32 connected to respective integrated circuits 31 and 33 are shown, although the cooling device could be extended at the broken line to include many integrated circuits or integrated circuit packages with individual resilient bellows pipe elements attached to the common evaporator section. A common problem encountered when attempting to utilize a common evaporator 36 can be height differentials between the integrated circuits devices 31 and 33. From a manufacturing standpoint, it is preferable to employ a common heat pipe design regardless of different integrated circuit heights. Use of a resilient bellows heat pipe element 38 readily accommodates different height integrated circuits in a multi-chip assembly.

In addition, a resilient bellows pipe element 38 which is expandable along all three axial dimensions permits absorption of stress between the integrated circuit terminals 39 and the circuit board 40 caused by thermal mismatch between the multi-chip assembly and the individual heat pipes. In a multi-chip assembly, when thermal pressure increases in one area of the assembly, the assembly may expand to alleviate the pressure, thus shifting in the x,y direction. Expansion could potentially dislodge the connections between the integrated circuits 31 and 33 and the circuit board 40. Expansion is especially detrimental when utilizing high terminal count integrated circuits where the integrated circuits 31, 33 are attached to the circuit board 40 by solder bumps. Expansion of the resilient bellows pipe element 38 enables the increased pressure to be absorbed before the solder bump connections between the integrated circuits 31, 33 and the circuit board 40 are detrimentally affected.

Although this description has proceeded with reference to an integrated circuit or integrated circuit package cooling mechanism, it is to be understood that cooling systems embodying the invention could be used in other thermo-syphon heat transfer systems in which it is desirable to have maximal heat dissipation from either one heat dissipative element or a series of heat dissipative elements into a common evaporator section.

While there has been shown and described a preferred embodiment of this invention, it is to be understood that various adaptations and modifications may be made within the spirit and scope of the invention as defined by the claims.

What is claimed is:

1. A cooling system comprising:
   an evaporator section in fluid flow communication with a condenser section;
   a resilient bellows pipe element having first and second ends;
   said first end of said resilient bellows pipe element attached in fluid tight relation and in communication with said evaporator section;
   a thermally conductive heat sink member having first and second opposed surfaces, said first opposed surface attached to said second end of said resilient bellows pipe element; and
   a plurality of spaced protuberances disposed on said second opposed surface of said thermally conductive heat sink member; and
   a layer of thermally conductive filling material disposed on said second opposed surface of said heat sink member filling spaces between said protuberances.

2. A cooling system according to claim 1, further comprising
   a heat dissipative device; and
   wherein said heat dissipative device is disposed against said plurality of protuberances and layer of thermally conductive filling material.

3. A cooling system according to claim 2, wherein said heat dissipative device is an integrated circuit.

4. A cooling system according to claim 1, in which said resilient bellows pipe element is capable of resilient movement along three axes.

5. A cooling system according to claim 1, further comprising:
   a plurality of heat dissipation fins upstanding from said first surface of said heat sink member and extending within said resilient bellow pipe element.

6. A cooling system according to claim 1 further comprising a working fluid filling said resilient bellows pipe element and contained in said evaporator section.

7. A cooling system comprising:
   a condenser in fluid flow communication with an evaporator;
   a plurality of resilient bellows pipe elements, each bellows element having first and second ends with said first end of each of said resilient bellows pipe elements attached in fluid tight relation and in communication with said evaporator;
   working liquid filling each said resilient bellows pipe element and contained in said evaporator section;
   a plurality of thermally conductive heat sink members each having first and second opposed surfaces, said first opposed surfaces respectively attached to a corresponding one of said second ends of said resilient bellows pipe elements;
   said second opposed surfaces of said thermally conductive members respectively attached to a corresponding plurality of heat dissipative devices by thermally conductive filling material;
   a plurality of spaced protuberances disposed on said second opposed surface of each of said thermally conductive members; and with
   said resilient bellows pipe elements resiliently urging said heat sink members individually toward said heat dissipative devices and said thermally conductive filling material disposed to fill regions between said plurality of protuberances for each of said plurality of heat dissipative devices.

8. A cooling system according to claim 7, wherein said heat dissipative devices are integrated circuit devices.

9. A cooling system according to claim 8, in which said integrated circuit devices are mounted on a common circuit board.

10. A cooling system according to claim 7, in which each said resilient bellow pipe element is capable of resilient movement along three axes.

11. A cooling system according to claim 7, further comprising:
    a plurality of heat dissipation fins upstanding from said first surface of each of said thermally conductive heat sink members and extending within said resilient bellows pipe element attached to that said heat sink member.

12. A cooling system comprising:
    an evaporator section in fluid flow communication with a condenser section;
    a resilient bellows pipe element having first and second ends;
    said first end of said resilient bellows pipe element attached in fluid tight relation and in communication with said evaporator section;
    working liquid filling said resilient bellows pipe element and contained in said evaporator section;
    a thermally conductive heat sink member having first and second opposed surfaces, said first opposed surface attached to said second end of said resilient bellow pipe element; a plurality of heat dissipation fins upstanding from said first opposed surface and extending within said resilient bellows pipe element; said second opposed surface incorporating spaced apart protuberances; and
    a heat dissipative integrated circuit attached by a layer of thermally conductive filling material to said second opposed surface of said heat sink member, said thermally conductive filling material comprising a malleable material filling spaces between said protuberances, said resilient bellows pipe element resiliently urging said heat sink member toward said heat dissipative device.

13. A cooling system according to claim 12, in which said resilient bellows pipe element is capable of resilient movement along three axes.

14. A cooling system according to claim 6 or claim 7 or claim 12, wherein said working liquid is selected from the group consisting of water and alcohol.

15. The apparatus of claim 1 or claim 7 or claim 12, wherein the material of said thermally conductive heat sink member is selected from the group consisting of copper, kovar and nickel.

16. The apparatus of claim 5 or claim 11 or claim 12, wherein the material of said upstanding fins is selected from the group consisting of copper and kovar.

17. The apparatus of claim 5 or claim 11 or claim 12, wherein said upstanding fins are rectangular in shape.

18. The apparatus of claim 1 or claim, 7, wherein said conductive filling material is a malleable metal.

19. A method applying a cooling system to a heat dissipative device, including the steps of:
   providing an evaporator section in fluid flow communication with a condenser section;
   providing a resilient bellow pipe element having first and second ends, wherein said first end of said resilient bellows pipe element is attached in fluid tight relation and in communication with said evaporator section;
   providing a thermally conductive heat sink member having first and second opposed surfaces, wherein said first opposed surface is attached to said second end of said resilient bellows pipe element and said second opposed surface includes a plurality of spaced protuberances;
   applying a layer of material between said second opposed surface of said heat sink member and a surface of a heat dissipative device to fill spaces between said protuberances;
   urging said resilient bellows over the heat sink causing said layer of material to fill included air voids between said heat sink and said heat dissipative device.

20. An apparatus comprising:
   a resilient bellows pipe element having first and second ends;
   a thermally conductive heat sink member having first and second opposed surfaces, said first opposed surface attached to said second end of said resilient bellows pipe element;
   a plurality of spaced protuberances disposed on said second opposed surface of said thermally conductive heat sink member; and
   a thermally conductive material disposed on said second opposed surface of said heat sink member to fill regions between said spaced protuberances.

21. The apparatus of claim 20, further comprising:
   a plurality of heat dissipation fins upstanding from said first surface of said heat sink member and longitudinally extending through said resilient bellow pipe element.

* * * * *